United States Patent [19]

Metzler

[11] 4,068,273

[45] Jan. 10, 1978

[54] HYBRID POWER SWITCH

[75] Inventor: Albert Metzler, San Jose, Calif.

[73] Assignee: International Telephone and Telegraph Corporation, New York, N.Y.

[21] Appl. No.: 647,451

[22] Filed: Jan. 8, 1976

[51] Int. Cl.² ............................................. H02H 7/22
[52] U.S. Cl. ......................................... 361/3; 361/7
[58] Field of Search ................. 317/11 A, 11 E, 11 R; 307/133, 136, 252 UA; 361/3, 5, 6, 7, 8, 13

[56] References Cited

U.S. PATENT DOCUMENTS

| | | | |
|---|---|---|---|
| 3,401,303 | 9/1968 | Walker | 307/133 X |
| 3,430,063 | 2/1969 | Webb | 317/11 A X |
| 3,458,800 | 7/1969 | Bross | 307/133 X |
| 3,614,464 | 10/1971 | Chumakov | 317/11 A X |
| 3,665,212 | 5/1972 | Roberts et al. | 307/252 UA X |
| 3,881,118 | 4/1975 | Forrest et al. | 307/252 UA |
| 3,890,560 | 6/1975 | Huellinghorst | 307/252 UA X |

FOREIGN PATENT DOCUMENTS 2,237,898  2/1974  Germany ........................ 317/11 A Primary Examiner—J D Miller
Assistant Examiner—Patrick R. Salce
Attorney, Agent, or Firm—William T. O'Neil

[57] ABSTRACT

A hybrid AC power switching arrangement in which two ganged switch banks in series are employed along with a pair of reverse parallel (back-to-back) SCRs across each contact pair of the second switch gang. SCR control means and interlock control means are provided so that the first switch gang (closest to the power source) closes first, energizing the SCR control and permitting the SCRs to conduct load current in a corresponding phase leg, beginning at or near a zero voltage cross-over point. After all phase legs are conducting through the SCRs, the second switch gang is closed bypassing the SCRs. On circuit break, the second switch gang (i.e., the one closest to the load) is opened first, the load current diverting immediately through the SCRs for another interim period until the SCRs in each individual phase leg are extinguished as the instantaneous current in the corresponding phase lead passes through or near zero. The first switch gang is then opened to completely disconnect from the line to insure against spurious SCR operation thereafter.

7 Claims, 5 Drawing Figures

HYBRID POWER SWITCH

BACKGROUND OF THE INVENTION

1. Field of the Invention

The invention relates to the field of AC power switching generally, and more specifically, to AC switching devices minimizing or substantially eliminating switch contact erosion.

2. Description of the Prior Art

One of the most significant problems encountered in the application of electric power switches, is the erosion of the contact material due to arcing encountered at the time of switch closure and again, at opening. The problem is aggravated when the load is reactive in character. Virtually all of the commonly used AC machines fall into this category in that they are inductive loads to a greater or lesser extent. Moreover, such AC machinery accounts for the great majority of the AC switching applications where substantial power levels are involved. Accordingly, the specification and the invention it describes, deals exclusively with alternating current power switching in single or poly-phase circuits.

Aside from the well known approaches of the prior art involving immersion of AC power switches in inert fluids, and aside from refinement of contact materials themselves, and still further, aside from the development of switch arc extinguishing devices, contact antibounce contrivances, and the development and application of vacuum switches notwithstanding, there has been in more recent prior art an effort made to exploit the precise controllability of solid state electronic devices as AC switching elements. Such solid state electronic components, particularly the so-called silicon-controlled rectifier have been applied in this connection. The silicon-controlled rectifier is commercially available in units with large current handling capability and reasonable voltage characteristics. The characteristics of the aforementioned silicon-controlled rectifier units have been employed as the sole switching element in AC circuits, and also in combination with conventional mechanically operated switch contacts.

Examples of the former, i.e., arrangements in which the solid state device (thyristor, SCR, etc.) is the switching element substantially without mechanical contact cooperation in the power leads, are U.S. Pat. Nos. 3,881,118; 3,551,701; 3,753,044; 3,456,133; 3,581,114.

Examples of the prior art in connection with hybrid switches are found in U.S. Pat. Nos. 3,812,382; 3,790,863; 3,706,087 and 3,421,023.

For purposes of this description, a hybrid switch is one employing electro-mechanical contacts and also solid state switching devices in the power carrying circuits.

Various of these references also teach the use of the highly controllable solid state device such as the thyristor or SCR, to effect a switch closing or opening at a voltage or current null along the isntantaneous waveform of the alternating voltage or current waveforms.

One of the significant disadvantages in the "all electronic" solid state switching arrangements, is the potential for exposure of the solid state device to voltage and current surges in the circuit between power line and load.

Moreover, the electronically controlled current path provided through the SCR or other solid state device, is subject to random or spurious firing. To deal with that problem, an ordinary mechanical switch contact has frequently been inserted in series with the solid state device, thereby eliminating the hazard of spurious current initation.

In either prior art case aforementioned however, it will be noted that the solid state device must be capable of carrying the full load current (drawn by the AC machine for example) over an extended period of time. This involves large and expensive solid state devices with massive heat sinks.

The manner in which the present invention deals with the disadvantages of prior art devices for the basic purpose, will be understood as this description proceeds.

SUMMARY OF THE INVENTION

A typical embodiment applying the principles of the present invention will be hereinafter described with reference to a three-phase power system, however, it will be readily understood by those skilled in this art that it could also be applied to single or two-phase arrangements.

The arrangement according to the present invention employs a first gang of switch contact pairs, each pair being intalled in series with a lead corresponding to one of the phases of the source. A second switch gang comprises two pairs of switch contacts, for interrupting two of the three phase leads of the three phase source, thereby completely interrupting all possible current paths into a delta or star-connected three-wire three phase load. It will be realized of course, that in the case of a four-wire three phase arrangement (where the fourth wire is a neutral connected to the center of the star or wye) the second switch bank would require three pairs of power switching contacts.

From the foregoing, it will be realized that, in a single-phase system, only one pair of contacts would be required in the first switch and only one in the second switch, both in series with the "hot" line.

In parallel across each switch contact pair constituting a switch element of the second switch gang, is a back-to-back (reverse parallel) pair of solid state devices, preferably of the silicon controlled rectifier type (SCR).

A switch operation delay and interlock arrangement is provided and operates as follows:

Assuming the first and second switch gangs are open at the outset, the load and all circuits are de-energized. To energize the load, the first switch gang is closed. This energizes the SCR control circuitry and after a brief settle-down time, enables the SCR gates in each phase lead discretely substantially at the time when the instantaneous alternating voltage across each SCR (and therefore across the corresponding second switch gang contact pair with which each back-to-back SCR pair is parallel) passes through zero. Thus, the individual SCRs are enabled and remain so until after the closure of the second switch gang, an event which substantially bypasses the SCRs. The second switch gang is not closed earlier than closure of the first switch bank plus a nominal delay interval, neither is the first switch gang opened prior to the opening of the second switch gang, plus the second delay interval.

Although the switch sequence can be operated manually, an interlocking, self-delaying, actuation device is described hereinafter.

In opening the circuit, the second switch gang is first opened, the SCRs then automatically picking up the load current during the opening delay interval aforementioned. However, upon opening of the second switch gang, the SCR control circuit removes the gates and SCR conduction automatically terminates substantially at the next point of zero current in the instantaneous AC current waveform, discretely in each phase lead. The second delay interval is not critical but like the first delay interval is at least a few cycles of the AC waveform, and thereafter, the first switch gang is opened.

It will be seen from the foregoing summary that the closure of the first switch gang produces a current flow only sufficient to actuate the various control circuits and breaks only after the SCRs have fully terminated the load current in all phase legs. The second switch gang makes only into the steady state load current in each phase leg and breaks in a low current carrying mode since the SCRs take up the current path at the time the second switch gang breaks.

A very significant advantage of the invention is that the switch contact erosion due to arcing is virtually eliminated in the unique combination of the invention and therefore, the individual contact pairs of both switch gangs need only be large enough to carry the steady load current, a significant economy. Contact service life is very greatly increased and the need for exotic contact materials is greatly decreased, a further economy.

Still further, the SCRs can be operated according to their short duty cycle current ratings ($I^2t$ ratings) and they therefore, may be significantly smaller in size than required prior art switching arrangements as hereinbefore discussed. Correspondingly, SCR heat dissipation is low, and massive heat sinks usually associated with SCRs used in power switching circuits are not required.

The manner in which the objective of the invention, namely, the provision of an economical and efficient hybrid AC power switching system which virtually eliminates contact erosion, is accomplished in a typical embodiment hereinafter described in detail.

BRIEF DESCRIPTION OF THE DRAWINGS

In the drawings, which are to be regarded as merely illustrative.

DESCRIPTION OF THE PREFERRED EMBODIMENT

Figure 1A:
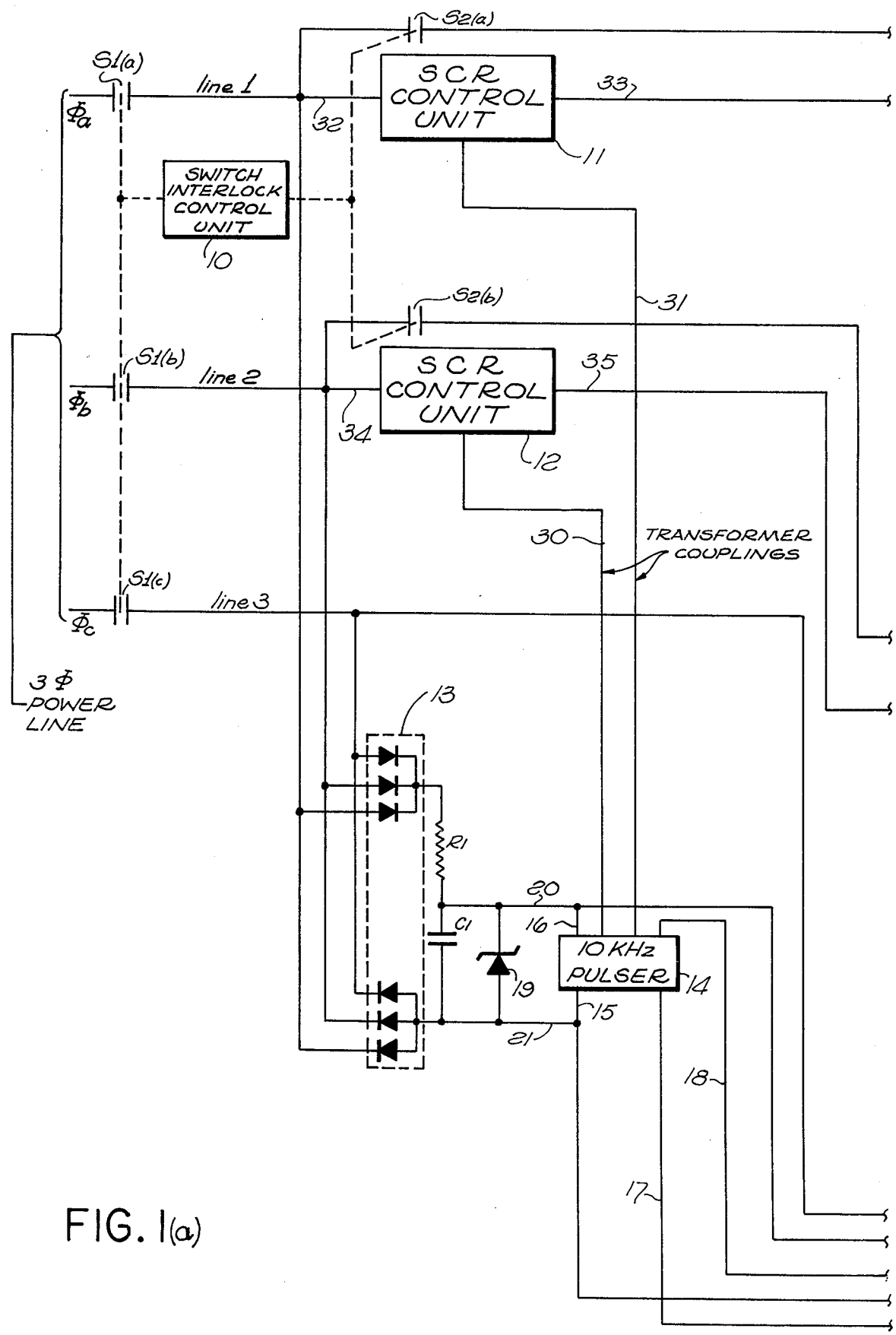
FIG. 1 is a schematic block diagram of a hybrid power switch according to the invention.

The description hereinafter is made with respect to a three-wire, three-phase, AC power system of the familiar delta or Y (star) type. Once the concepts of the present invention are understood in accordance with the description hereinafter, it will be realized that the invention is also applicable to single phase or other polyphase arrangements.

A set of ganged switch contacts S1($a$), S1($b$) and S1($c$) are arranged to interrupt all incoming power to the device through the three respective leads $\phi_a$, $\phi_b$, and $\phi_c$. After passing through the switch contacts of S1, these phase leads are also referred to as lines 1, 2 and 3, respectively. Of those lines, 1 and 2 feed SCR control units 11 and 12, respectively, and also the ganged switch contacts S2($a$) and S2($b$), respectively. Control transformers CT1 and CT2 have their primaries in series with the outputs of 11 and 12, respectively, and the output phase lines $\phi'_a$ and $\phi'_b$ connect not only to the corresponding S2 contacts in each case, but also to one of the SCR units through the corresponding control transformer primary as illustrated.

For the complete disconnection of all supply voltage to the unit, the aforementioned sections of S1 comprise three ganged switch contact sets, however, the third contact of S2 which would correspond to S1($c$) is omitted as unnecessary as will be understood hereinafter.

A three-phase full-wave rectifier 13 is connected to lines 1 through 3 to produce a source of at least partially filtered DC to operate the 10 KHz pulser 14 and the inhibit circuits comprising Q2, TN1 and associated circuit parameter components on the one hand and Q3 and TN2 with associated parameter components on the other hand. The DC supply produced by 13 appears across a zener diode 19 poled so that leads 20 and 21 are relatively positive and negative, respectively.

The leads 30 and 31 represent the magnetic coupling between primary and secondary of pulse transformers T1 and T2. The primaries of these transformers are in the circuitry of 14 whereas the secondaries are connected in the circuitry of 11 and 12, respectively. Thus, 30 and 31 are not electrical connections per se, but only symbolic of that magnetic coupling. Leads 15 and 16 are DC leads to pulser circuit 14 and leads 17 and 18 are inhibit control lines operating to control the SCR pulsing in 11 and 12 in accordance with the dictates of the inhibit control circuits aforementioned. These functions will be more completely described as this specification proceeds.

Figure 2:
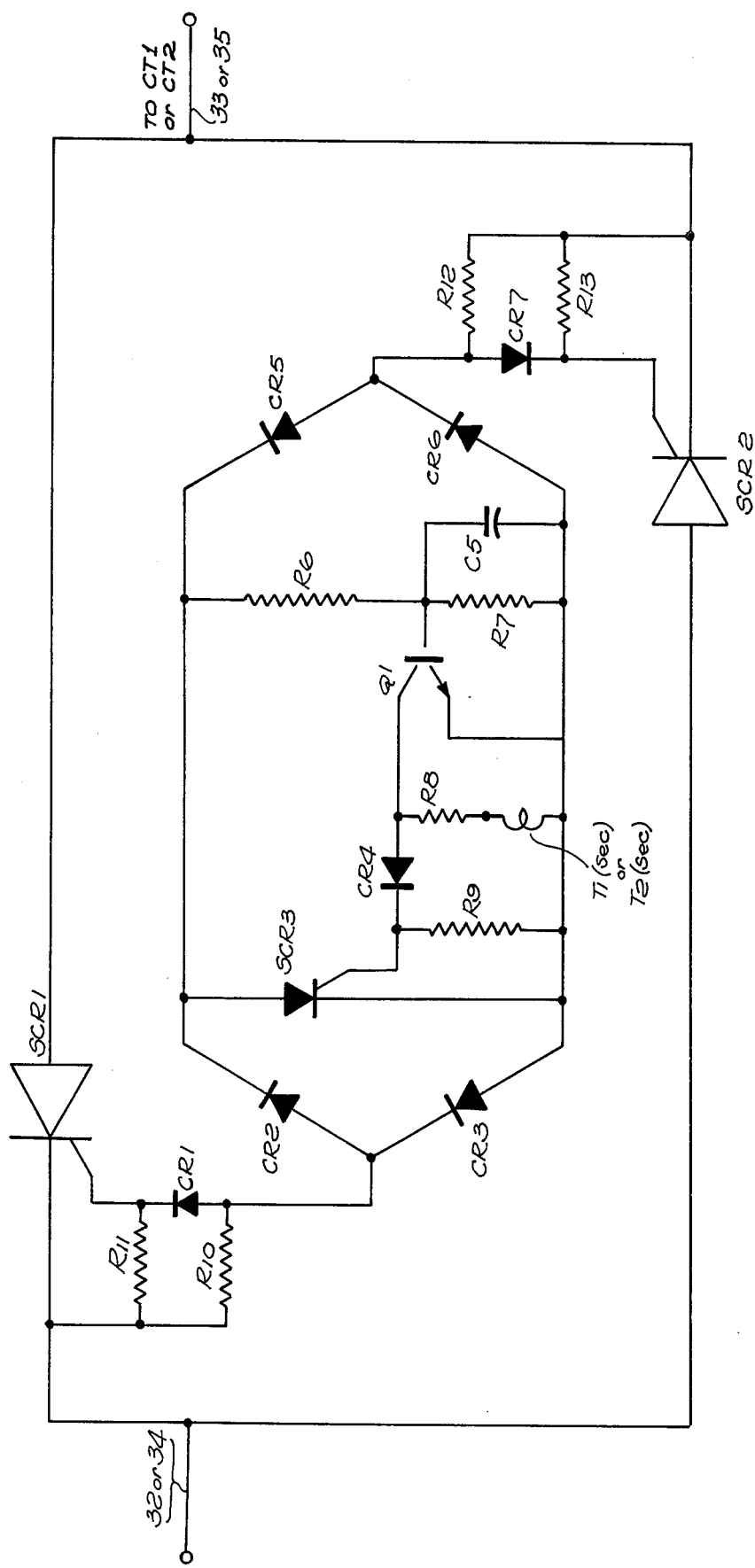
FIG. 2 is a schematic detail of the SCR control units of FIG. 1.

Referring now to FIG. 2, the circuit details of the SCR control units 11 and 12 are shown. These units 11 and 12 may be identical in construction. Each includes a pair of silicon-controlled rectifiers SCR 1 and SCR 2 connected in reverse parallel such that SCR 1 has its cathode electrode connected to the input connection 32 (or 34 in the cse of unit 12). Similarly, SCR 2 has its anode electrode connected to 32 (or 34). The anode connection of SCR 1 and the cathode connection of SCR 2 are then connected together and to 33 in the case of SCR unit 11 or 35 in the case of SCR unit 12. The only other external connection to the circuits within the control unit blocks 11 and 12 is via the transformer coupling through transformers T1 and T2 from the pulser unit 14. FIG. 2 will be more fully described hereinafter in connection with the overall operation.

Figure 3:
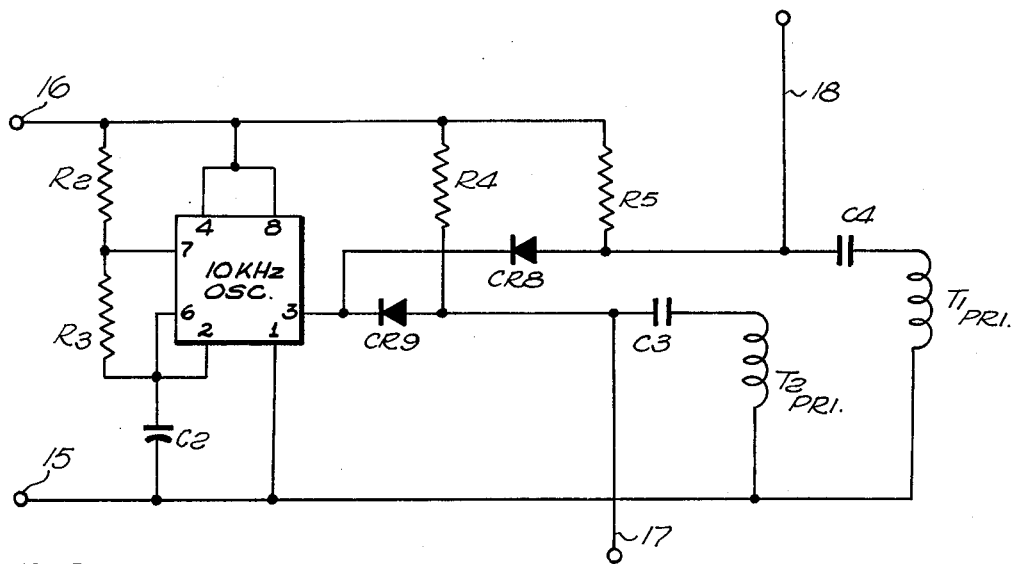
FIG. 3 is a schematic detail of the 10 KHz pulser of FIG. 1.

FIG. 3 provides a typical detailed circuit for providing the functions of the pulser circuit 14.

The heart of the pulser unit of FIG. 3 is the 10 KHz oscillator. That device is shown as an integrated circuit module, a commercially available component, such as the type NE 555 manufactured by Signetics Corporation. The components R2, R3 and C2 are chosen consistent with the operation of this oscillator in the vicinity of 10 KHz at the particular supply potential between 15 and 16. It will be realized that the 10 KHz frequency is nominal, and not at all critical. In fact, there are no critical relationships in voltages, frequencies, thresholds of conduction, et seq., throughout the entire system of the present invention.

Three-phase power systems of the 220/240 volts per phase or 440/480 volts per phase account for a large percentage of the three-phase power circuits employed in the United States, and the specific parameters involved may be optimized for each of these particular operating voltages, but a considerable variation of voltage plus and minus can be accommodated with the same resistor and capacitor parameter values. A nominal 220/240 volt design, for example, might well accommodate a 120/208 four-wire three-phase star source.

The output of the 10 KHz oscillator circuit block (FIG. 3), is fed to two diodes CR8 and CR9 which allow only negative-going pulses to pass. These diodes are biased by resistors R5 and R4, and the terminals 18 and 17 provide the inhibiting function previously referred to. When inhibited by other circuitry, the pulses are not permitted to pass through capacitors C3 and C4 to the primaries of T2 and T1, respectively, and are therefore not applied to the SCR control units.

Let it be assumed that in an initial condition the gang switches S1 and S2 are open. Either through manual operation of switch gangs S1 and S2, or by means of known mechanical interlock (sequencing) devices, or still further by means of an electrical interlock circuit to be explained in connection with FIG. 4, the S1 switch gang is closed. The S2 contacts remain open for the time being. The three-phase voltages $\phi_a$, $\phi_b$ and $\phi_c$ are applied to SCR control inputs 32 and 33 (to 11 and 12), and directly to $\phi'_c$, respectively, as illustrated. SCRs 1 and 2 in each of the blocks 11 and 12 are not immediately triggered into conduction and ganged contacts S2 are still open; accordingly, there is no application of power to the three-phase load terminals $\phi'_a$ and $\phi'_b$.

Figure 1B:
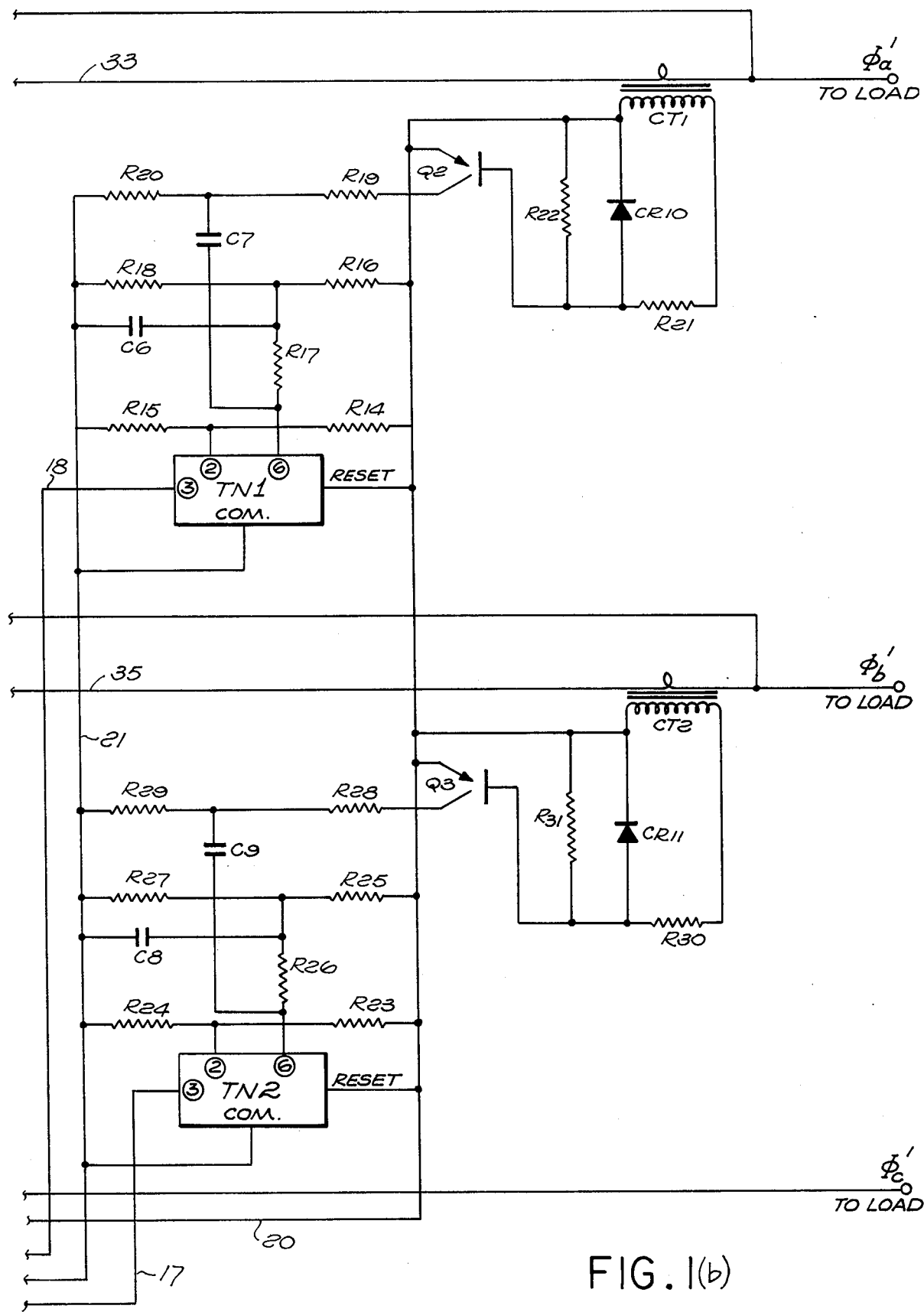

Capacitor C1 on FIG. 1 provides some filtering of the rectified voltage from 13, but more importantly delays the start-up of the pulsing circuit 14 for approximately 4 milliseconds to avoid random turn-on of SCR 1 or 2 in either of the blocks 11 or 12 during an initial half-cycle of the line power after closure of the S1 contacts. At this point in the description it should be realized that time delay figures quoted in this specification relate generally to 60 Hz power frequency, but of course the invention is not at all limited to 60 Hz operation, other higher or lower power frequencies being readily accommodated. Once the principles and operational parameters of the device to the present invention are fully understood, appropriate modifications are readily made by those skilled in this art if other power line frequencies are involved.

Once the relaxation oscillator or pulser 14 is fully oprative in about 4 millisec, pulses are developed across the secondary windings of T1 and T2 (see FIG. 2). These pulses are applied to the network consisting of resistor R8 and diode CR4, unless these pulses are inhibited through operation of transistor Q1. This inhibition is effected through conduction of Q1 except when the line voltage passes through instantaneous zero (plus or minus approximately 10 volts), during which time the transistor Q1 is not biased into conduction. Accordingly (during one half-cycle), for instantaneous line voltage values greater than approximately 10 volts (peak), as provided through the path including R10, CR2, R6, (base-to-emitter path), CR6 and R12, this network effectively applies a portion of the line voltage to the base of Q1. For the other half cycle the conduction path includes R10, CR3, Q1 (base-to-emitter path), R6, CR5 and R12. Resistor R7 is a leakage stabilizing resistor for Q1, and R9 provides the same function for the small SCR No. 3. Accordingly, the point produced by the junction of CR4, R8 and the collector of Q1 may be thought of as clamped and not permitting passage of the T1 (or T2) secondary pulses to energize the SCR 1 and SCR 2 gate electrodes, except in the vicinity of zero instantaneous alternating phase voltage as aforementioned. The current path including R10, CR2, SCR 3, CR6 and R12 provides sufficient current under these conditions to forward bias diode CR7 during one half-cycle of the line voltage alternation and CR1 during the other half-cycle. Forward bias current flows through these respective diodes CR1 and CR7 and into the gate terminals of the power switching SCRs No. 1 and No. 2 to complete the closing of the circuit to load at or near zero instantaneous phase voltage in each of the units 11 and 12 separately. SCRs No. 1 and No. 2 are required in order to afford conduction on both positive and negative-going line voltage alternations.

The diodes CR2, CR3, CR5 and CR6 form a circuit bridge which provides a current path for SCR 3 during both power half cycles.

The conduction of SCR 1 and SCR 2 is sensed by current transformer CT1 in the phase A line and by CT2 in the phase B line as indicated on FIG. 1. This provides a drive current to cause Q2 in the inhibit circuit associated with 11 (or Q4 in the inhibit circuit corresponding to SCR control unit 12) to be pulsed on during alternate half-cycles of the power line alternations through R21 (R30). Resistor R22 (R31) provides leakage stabilization for Q2 (Q3). Leakage stabilization is, of course, a provision of a resistor substantially lower in value than the effective open-circuit emitter to collector path resistance of transistor Q2 or Q3.

Diode CR10 (CR11) allows full AC current conduction in the secondary of CT1 (CT2). Conduction of Q2 (Q3) couples pulses through capacitor C7 (C9) to the trigger input of timing network of TN1 (TN2), which includes resistor R14 (R23), R15 (R24), R16 (R25), R18 (R27), R17 (R26), capacitor C6 (C8) and a dual integrated circuit timer module (chip), half of which is represented at TN1 and the other half at TN2. This device comprising TN1 and TN2 is a commercially available integrated circuit component which "latches" and thereby provides a continuous conduction to ground from its terminal 3 as illustrated. The rest of TN1 or TN2 is accomplished only after the S1 switch contact gang is opened, deenergizing the rectifier 13 and permitting the voltage between 20 and 21 to fall to zero. With the "latching" condition of TN1 and TN2, the pulses from 14 are inhibited in view of the inhibit lines 17 and 18 being effectively grounded.

The "time out" of the time circuits TN1 and TN2 occurs in each case when the terminal 6 (of TN1 or TN2) instantaneous potential reaches approximately 60 percent of the supply voltage maximum as regulated by zener diode 19. Resistor R16 (R25) and R18 (R27) allow capacitor C6 (C8) to charge up to 30 percent of this supply voltage within approximately 50 milliseconds. The pulse amplitude coupled through C7 (C9) from the resistor divider formed of R19 and R20 (R28 and R29) amounts to approximately 40 percent of the supply voltage value, i.e., the voltage between 15 and 16. The sum of these two voltages instantaneously exceeds 60 percent of the supply voltage (across zener diode 19) and inhibits triggering of SCR 3 (see FIG. 2), thus removing power from the load approximately 50 milliseconds after it was applied in the event that the S2 contacts are not manually or otherwise closed before that time. This can be varied, of course, as required for proper sequencing with the closure time of the S2 contacts as dictated by other circuitry. The purpose of this feature is protection of the main SCRs 1 and 2 from overheating if they are not duly relieved of their current carrying function by closure of the S2 switch gang in a timely fashion. It will be recalled in this connection, that one of the important features of the combination of the present invention vis-a-vis prior art solid state power switching devices is that the duty cycle of the SCRs is low and therefore smaller SCRs with much more modest heat sinks, etc., serve the purpose.

During normal operation, the S2 contacts will close or be closed before the voltage charge on C6 (C8) reaches 20 percent of the voltage across the zener diode 19. Closure of the S2 contacts, of course, diverts the load current from the SCRs 1 through 4 in that the S2 contacts are electrically in parallel with these SCRs. Upon S2 gang switch closure, the flow of current through the primaries of CT1 and CT2 is interrupted, and thus transistor Q2 (Q3) ceases to conduct and no pulses are coupled through capacitor C7 (C9) thereafter, until the entire process is reinstituted. A steady state condition is reached in which contacts S1 and S2 carry the load current, but neither has been required to close into an initial surge, nor has either been required to interrupt with a substantial AC voltage remaining across it nor with substantial current flowing through it. Capacitor C6 (C8) is charged to 30 percent of the zener supply voltage, and accordingly, timer TN1 (TN2) will not time and its terminal 3 remains in an "off state" (not grounded).

In disconnecting power from the load, the sequence involves first opening the S2 contacts. Obviously this will occur at any arbitrary time with respect to the power line alternations, i.e., at any instantaneous voltage value plus or minus. The SCR units 11 and 12 immediately "pick up" the load current. Some line current is diverted through R10 immediately on the opening of S2(a), for example. Diodes CR1 and CR4 and resistor R12 carry this current, which results in the immediate development of a gate drive for the power switching SCRs 1 and 2. Capacitor C5 and resistor R6 allow sufficient time delay in the turn-on of Q1 to allow several pulses in the secondary of T1 (T2 secondary in the case of SCR unit 12) to trigger the relatively small SCR No. 3, assuring that line current is immediately handled by the power SCR1 and SCR2 units according to the instantaneous polarity of the alternations as contacts S2 open.

During the time that both S1 and S2 switch banks are closed, the rectifier circuit 13 continues to be fully operative, as is the pulser 14, therefore no delay is encountered comparable to the intentional delay hereinbefore described upon the initiation of S1 switch bank.

In accordance with the foregoing, line current will now be seen to be flowing through the primary windings of CT1 and CT2, and therefore transistors Q2 and Q3 conduct on the first positive half-cycle of the line current encountered by each. Conduction of Q2 (or Q3, for that matter) causes a pulse equal to 40 percent of the supply voltage across the zener diode 19 to be coupled through C7 (C9) to terminal 6 of TN1 (TN2). The addition of a 40 percent pulse to the steady state 30 percent level at terminal 6 of TN1 (TN2) causes those devices to trigger and conduct to ground through their respective No. 3 terminals, thereby inhibiting pulses from the gate electrodes of SCR3. As the line current passes through zero, the relatively small control SCR (No. 3) ceases conduction with the result that the power SCRs likewise open, breaking the power supply at the low terminals. All that remains is the reopening of the S1 switch gang, which may be accomplished at any later time. Since the isolation of the solid state control circuitry from the possibility of spurious initiations was indicated to be one of the advantages of the combination of the present invention, it is highly desirable that the S1 contacts be opened shortly thereafter.

Once the S1 contacts are open, the power is removed from the rectifier unit 13 and the pulser 14 and inhibiting timers TN1 and TN2 cease to operate. TN1 and TN2 automatically reset during the next turn-on of S1 to allow the sequence as hereinbefore described in connection with "turn-on" to be repeated.

Figure 4:
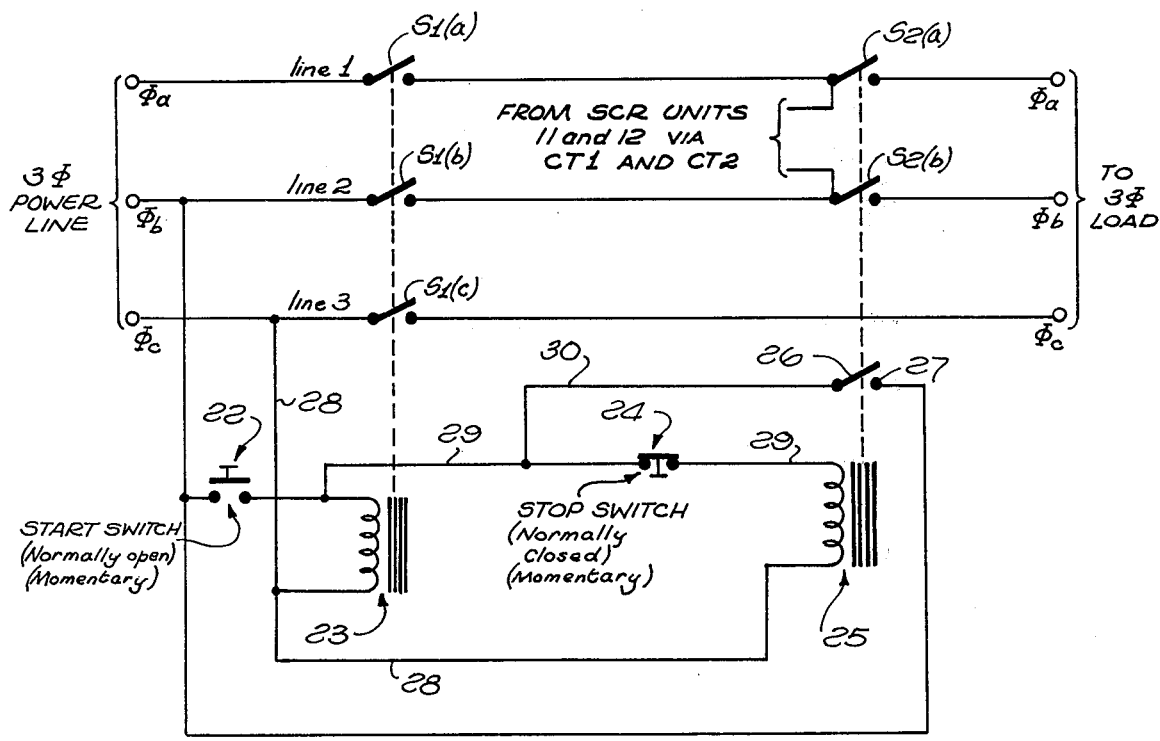
FIG. 4 is a schematic detail of a typical switch interlock control unit as depicted in FIG. 1.

Referring now to FIG. 4, a switch bank sequencer will be described. Basically, such a device can externally resemble the push to start (first pushbutton) and push to stop (second pushbutton) arrangement which is particularly familiar in large electric motor controls.

Pushbutton 22 is normally open and 24 is normally closed. Pushing 22 to close it energizes relays which close the S1 bank and the S2 bank via relay magnetic actuators 23 and 25, respectively. Relay 23 is designed to close promptly, however 25 is of the type which introduces some automatic delay, therefore providing the aforementioned delay required between closure of the S1 switch bank and the S2 switch bank, giving the electronic circuits time to operate according to the foregoing description.

Thereafter, when pushbutton switch 24 is operated to initiate power disconnection, relay 25 (and therefore the S2 contact bank) opens promptly, however, relay 23 cannot disconnect until contacts 26 and 27 are open. Relay 25 can be constructed such that there is a mechanical delay between S2(a) and S2(b) opening and the opening of the lower power contact pair (26 and 27).

It will be recognized by those skilled in this art, that there are purely mechanical devices for providing the functions of FIG. 4, for example in the "start-run" cycling switches for large motors. Moreover, this S1/S2 programming can be entirely manual as indicated hereinbefore.

It will be noted that the SCR control units 11 and 12 could be accompanied by a third such unit in the line of $\phi_c$ (line 3) as an alternative. In fact, in dealing with the three-phase, four-wire Y (star) type three-phase supply situation, such as the familiar 120/208 volt arrangement, a third SCR control unit would be required. This is because phase C would otherwise continue to supply current to one phase of the load during the interim or transition time when S1 is closed but S2 is open. From an understanding of the present invention in accordance with the foregoing, those skilled in this art can readily implement this additional circuitry.

Various other modifications and variations of the specific circuits and arrangements will suggest themselves to those skilled in this art once the principles of the present invention are understood. Accordingly it is not intended that the drawing in this specification should be considered as limiting the scope of the invention. The drawings and this description are to be regarded as typical and illustrative only.

What is claimed is:

1. An AC electric power switching device for automatically energizing and deenergizing a three-phase power circuit in response to a corresponding single manual action for each of said energizing and deenergizing functions, comprising:

first and second switch banks in series between a power source and a load with said first switch bank being nearest said power source, said first switch bank comprising three pairs of switch contacts, one to each phase line, said second switch bank comprising two pairs of switch contacts with one pair to each of a predetermined two of said three phase lines;

electronically controllable means comprising a pair of solid state devices of the thyristor family, one of which is connected in parallel with each of said second contact pairs in said two predetermined phase lines, the phase line other than said predetermined two being connected directly from a corresponding contact of said first switch bank to said load;

first means activated by closing of said first switch bank for initiating current conduction in each of the current-carrying paths provided by said electronically controllable means when the instantaneous phase voltage is zero within a predetermined ignition tolerance in the corresponding phase line of said sources, said first means also including circuits for closing said second switch bank after a predetermined delay time to bypass current around said electronically controllable means in each of said current-carrying paths, said first means further including circuits for causing interruption of current in each of said paths as said electronically controlled means senses zero instantaneous current within a predetermined tolerances after said second switch bank has been opened to begin the disconnect process;

and second means for opening said first switch bank after a second predetermined delay time after all of said current-carrying paths through said electronically controlled means have interrupted at said zero instantaneous currents.

2. Apparatus according to claim 1 in which said electronically controlled means each includes a pair or reverse paralleled solid state power devices responsive to control signals to determine their times of conduction.

3. Apparatus according to claim 2 in which said solid state power devices are SCR elements.

4. Apparatus according to claim 3 in which said control signals operating to determine said SCR element times of conduction are defined as being pulses of frequency high compared to the frequency of said power source thereby to effect conduction control of said SCR elements within a relatively short fraction of a cycle of the alternations of said power source.

5. Apparatus according to claim 1 in which third means are included to program said first and second switch banks such that said first switch bank closes before said second switch bank, said second switch bank being automatically closed after said first predetermined time delay interval, said third means further constraining said first switch bank from opening until elapse of said second predetermined time delay after opening of said second switch bank.

6. A hybrid switching system for energizing and de-energizing a load from an AC source of at least single phase substantially without switch contact erosion, comprising:

first means including a first switch gang including at least one pair of first switch contacts for each phase of said AC source, said contact pairs each being in series with a lead corresponding to one voltage phase between said source and said load;

second means including a sufficient number of pairs of ganged second switch contacts each arranged in series with a corresponding one of said leads between said first means and said load to make and break all current paths between said source and said load;

third means comprising a solid state switchable conduction device for providing controllable separate current paths in parallel with each of said second contact pairs, said solid state devices being responsive to control signals for separately controlling the shunt conductivity thereby provided in parallel with each of said second contact pairs;

fourth means oprative upon closure of said first means switch gang for generating said control signals in a sense causing said third means solid state devices to conduct beginning after closure of said first means switch gang, said fourth means being responsive to the voltage across each of said second switch contact pairs to generate and apply a discrete control signal to the corresponding third means solid state device beginning substantially when the instantaneous AC voltage across said corresponding second switch contact pair is substantially zero, thereby energizing said load through said third means when said switch contacts of said first means have been closed;

fifth means responsive to closure of said switch contacts of said first means for closing said ganged second switch contacts, said fifth means including delay means whereby a first transition time is allowed after which said second switch contacts are closed in parallel with said third means, and sixth means for preventing the opening of the contact pairs of said first means for de-energizing said load before the expiration of a second transition time after opening of said contact pairs of said second means; and also including means responsive to the opening of said second means contact pairs and to the current flowing through each of said contact pairs of said second means for interrupting said fourth means control signals to each of said third means solid state devices at the time the instantaneous current in the corresponding third means element passes substantially through zero.

7. Apparatus according to claim 6 in which said solid state devices are defined as SCR elements connected in reverse paralleled pairs, one pair in shunt with each of said contact pairs of said second means.

* * * * *